(12) United States Patent
Hata et al.

(10) Patent No.: US 6,383,835 B1
(45) Date of Patent: *May 7, 2002

(54) IC PACKAGE HAVING A CONDUCTIVE MATERIAL AT LEAST PARTIALLY FILLING A RECESS

(75) Inventors: Fumio Hata, Mitaka; Tadashi Kosaka, Atsugi; Hisatane Komori, Ayase, all of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/707,046

(22) Filed: Aug. 30, 1996

(30) Foreign Application Priority Data

| Sep. 1, 1995 | (JP) | 7-225296 |
| Sep. 1, 1995 | (JP) | 7-225297 |
| Aug. 29, 1996 | (JP) | 8-228079 |

(51) Int. Cl.⁷ .................................................. H01L 21/44
(52) U.S. Cl. .................... 438/65; 438/113; 438/127; 438/667; 257/433
(58) Field of Search .................. 257/81, 432, 433, 257/459, 774, 787, 730, 788, 698; 361/760, 767, 768, 737, 772; 438/64, 65, 113, 127, 667

(56) References Cited

U.S. PATENT DOCUMENTS

| 4,924,282 A | 5/1990 | Komiyama et al. | 357/30 |
| 5,079,190 A | 1/1992 | Mihara | 437/220 |
| 5,081,347 A | 1/1992 | Matsumato | 250/211 |

(List continued on next page.)

FOREIGN PATENT DOCUMENTS

EP          0493051 A1      7/1992

(List continued on next page.)

OTHER PUBLICATIONS

Patent Abstracts of Japan, vol. 011, No. 227 (E–526), Jul. 23, 1998 & JP 62 043139 A (Olympus Optical Co Ltd), Feb. 25, 1987, Hideo.

Patent Abstracts of Japan, vol. 006, No. 211 (E–137), Oct. 23, 1982 & JP 57 115850 A (Nippon Denki KK), Jul. 19, 1982, Takashi.

(List continued on next page.)

*Primary Examiner*—Minh-Loan Tran
(74) *Attorney, Agent, or Firm*—Fitzpatrick, Cella, Harper & Scinto

(57) ABSTRACT

An IC package has a substrate having recesses formed on the side wall thereof, an insulating film for covering an opening of each recess on the side of a principal surface of the substrate, and an IC chip mounted on a mount surface side of the film on the substrate, wherein a conductive portion formed on each recess is used as an external connection terminal for the IC chip. A method of assembling an IC package has the steps of forming a substrate having a plurality of through holes each having an insulating film covering one of the openings of each through hole, mounting one or more IC chips on a principal surface of the substrate on the insulating film side, and electrically connecting the IC chip and the through holes, sealing the substrate with the IC chip mounted thereon with insulating resin, and cut the substrate with the IC chip mounted thereon to expose the side wall of each through hole.

33 Claims, 12 Drawing Sheets

U.S. PATENT DOCUMENTS

| | | | |
|---|---|---|---|
| 5,098,630 A | | 3/1992 | Ogiu et al. ............ 264/272.15 |
| 5,438,216 A | * | 8/1995 | Juskey et al. ................ 257/433 |
| 5,440,451 A | * | 8/1995 | Saito et al. .................. 257/787 |
| 5,729,437 A | | 3/1998 | Hashimoto .................. 361/760 |
| 5,912,504 A | | 6/1999 | Yoshizawa .................. 257/730 |

FOREIGN PATENT DOCUMENTS

| | | |
|---|---|---|
| EP | 0582881 A1 | 2/1994 |
| JP | 63021878 | 1/1988 |
| JP | 2002150 | 1/1990 |

OTHER PUBLICATIONS

Patent Abstracts of Japan, vol. 012, No. 228 (E–627), Jun. 28, 1988 & JP 63 021878 A (Canon Inc.), Jan. 29, 1988, Keiji.

Patent Abstract of Japan, vol. 014, No. 133 (E–0902), Mar. 13, 1990 & JP 02 002150 A (Citizen Watch Co Ltd.), Jan. 8, 1990, Masahiro.

* cited by examiner

IC PACKAGE HAVING A CONDUCTIVE MATERIAL AT LEAST PARTIALLY FILLING A RECESS

BACKGROUND OF THE INVENTION

1. Field of the Invention

The present invention relates to a package for integrated circuits and to a method of assembly thereof.

2. Related Background Art

In order to assemble an IC chip on a circuit board, the IC chip is first assembled in a resin sealed package using a lead frame such as those shown in FIGS. 1 to 5 or in a package with a hollow portion such as shown in FIG. 6.

The assembly method for resin sealed packages shown in FIGS. 1 to 5 will be described.

First, photosensor IC chips are placed on a lead frame (shown in FIG. 1) made of a thin metal plate on which a predetermined circuit pattern is formed through pressing or etching, connections are made by using bonding wires 5 (shown in FIG. 2), and the photosensor IC chips are molded with transparent thermosetting resin 6 (shown in FIG. 3). Thereafter, leads are cut and shaped into a predetermined configuration (shown in FIG. 4). This method is widely adopted because mass production is possible and soldering to a circuit board is relatively easy.

In order to package an IC having a photosensor element, a light transmissive member 9 such as shown in FIG. 5 is bonded in order to prevent damages to the light-incidence plane and eliminate unnecessary light reflection (Japanese Patent Laid-open Application No. 63-21878).

For assembly of the package shown in FIG. 6, a photosensor IC chip 4 is placed in a hollow portion 10 of a ceramic or resin mold, connections are made by using bonding wires, and the hollow portion 10 is covered with a light permissive member 9 to hermetically seal it. With this structure, a bonding margin for maintaining the hermetic seal is required, resulting in a large package size.

These conventional methods are associated with various issues to be resolved. For example, expensive metal molds are required for each type of package. Production of various types of packages requires immense investment in facilities. It takes a long time to complete a sample which requires new metal molds. Leads are likely to be broken depending upon how the package is handled. An additional process for bonding the light permissive member 9 is required and the assembly cost rises.

A package of a lead-less structure has been proposed using a both-side printed circuit board in place of a lead frame (Japanese Patent Laid-open Application No. 2-2150). However, this method uses metal molds like the above methods so that it is associated with similar problems.

SUMMARY OF THE INVENTION

It is an object of the present invention to provide an IC package and one assembly method therefor that make it possible to dispense with metal molds, render unnecessary immense investment in facilities even for production of various types of packages, are applicable to mass production with low assembly cost, and make it easy to solder an IC chip to a circuit board.

According to one aspect of the present invention is provided an IC package comprising: a substrate having recesses formed on the side wall thereof; an insulating film for covering an opening of each recess on the side of a principal surface of the substrate; and an IC chip mounted on a mount surface side of the film on the substrate, wherein a conductive portion formed in each recess is used as an external connection terminal for the IC chip.

According to another aspect of the invention is provided a method of assembling an IC package comprising the steps of: forming a substrate having a plurality of through holes each having an insulating film covering one of the openings of each through hole; mounting one or more IC chips on a principal surface of the substrate on the insulating film side, and electrically connecting the IC chip and the through holes; sealing the substrate with the IC chip mounted thereon with insulating resin; and cut the substrate with the IC chip mounted thereon to expose the side wall of each through hole.

According to another aspect of the present invention is provided an IC package comprising: a substrate having recesses formed on the side wall thereof; an insulating film for covering an opening of each recess on the side of a principal surface of the substrate; an IC chip mounted on a mount surface side of the film on the substrate; a resin portion for sealing the IC chip; and a rigid member formed on the resin portion, wherein a conductive portion formed on each recess is used as an external connection terminal for the IC chip.

It is another object of the present invention to provide an IC package comprising: a substrate having recesses on the side wall thereof, the recesses being filled with conductive material; an IC chip mounted on one principal surface of the substrate; a transparent resin portion for sealing the IC chip; and a light transmissive member formed on the transparent region portion, wherein the filled conductive material at the side wall of the substrate is used as an external connection terminal for said photosensor IC chip.

According to another aspect of the present invention is provided a method of assembling an IC package comprising the steps of: forming a substrate having a plurality of through holes each having an insulating film covering one of the through hole openings; mounting one or more IC chips on a principal surface of the substrate on the insulating film side, and electrically connecting the IC chip and the through holes; forming a light transmissive member on a transparent resin portion formed on the substrate having the IC chip mounted thereon; and cutting the substrate with the IC chip mounted thereon to expose the side wall of each through hole.

According to another aspect of the present invention is provided a method of assembling an IC package comprising the steps of: forming a substrate having a plurality of through holes each having conductive material filled in the through hole opening; mounting one or more IC chips on a principal surface of the substrate on the insulating film side, and electrically connecting the IC chip and the through holes; forming a light transmissive member on a transparent resin portion formed on the substrate having the IC chip mounted thereon; and cutting the substrate with the IC chip mounted thereon to expose the conductive material in each through hole.

According to several embodiments of the invention, thus a plurality of through holes in a printed circuit board are used as external connection terminals, instead of using conventional leads. Therefore, metal molds for lead frames are not required for each type of IC chips as in conventional cases.

Since the through hole is covered with an insulating film or filled with conductive material, resin will not flow via the through hole to the back surface of the substrate, and so it is not necessary to prepare metal molds for stopping a flow of resin.

Since the side wall of the through hole cut vertically or the conductive material in the cut through hole is used as an external connection terminal, leads are broken less than is the case with conventional leads.

If transparent resin is used when necessary and a light transmissive member having a high rigidity such as glass is placed on the transparent resin, it becomes possible to prevent damage to the surface of the transparent, resin, and becomes easy to retain optical flatness. An IC package of this invention is preferably used for optical semiconductor elements such as optical sensors, light emitting diodes, and semiconductor lasers.

Since the light permissive member is adhered at the same time as the resin is coated and cured, an increase in the number of processes can be prevented. Furthermore, since an additional margin is not necessary, the outer dimension of the IC package can be made small.

DETAILED DESCRIPTION OF THE PREFERRED EMBODIMENTS

Embodiments of the present invention will be described in detail with reference to the accompanying drawings.

Figure 1:
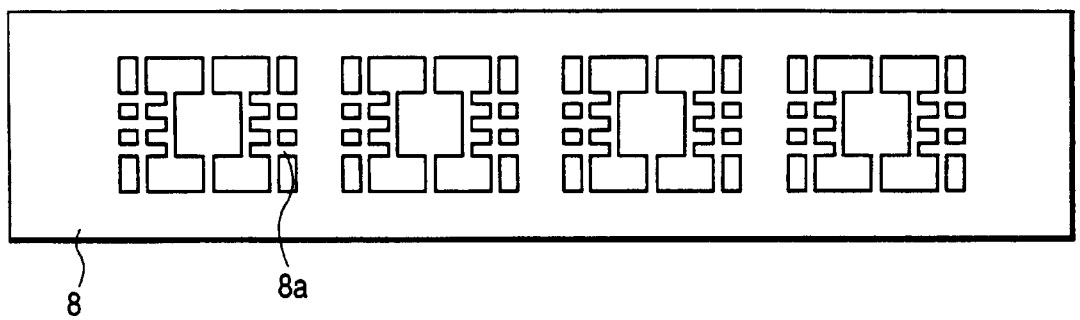
FIGS. 1 to 4 are plan views illustrating assembly processes according to conventional techniques.
Figure 2:
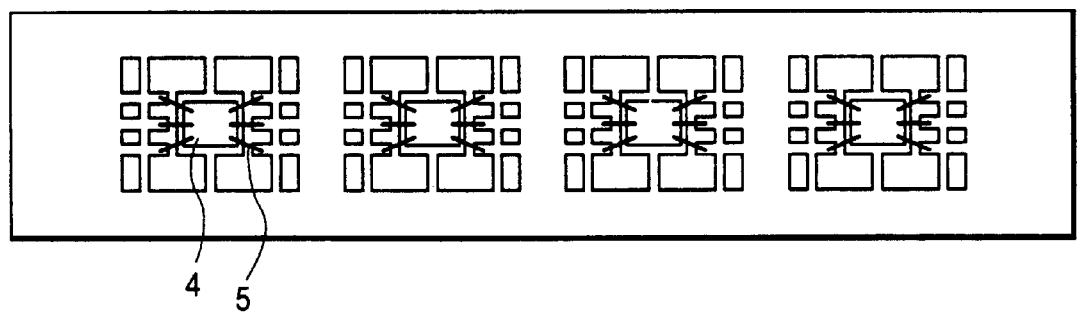
Figure 3:
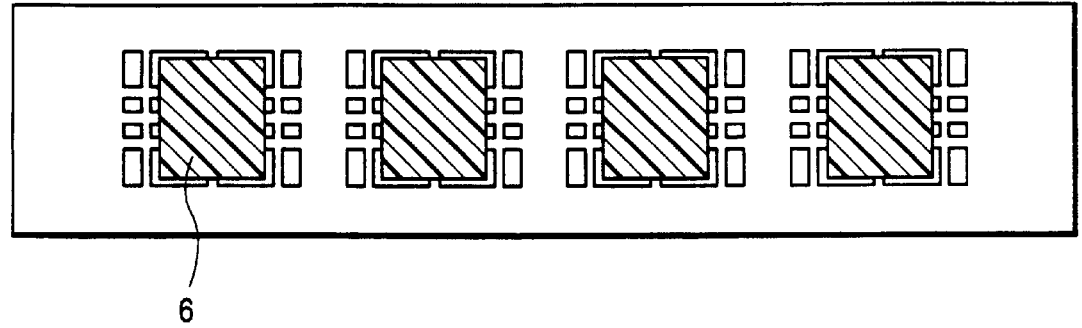
Figure 4:
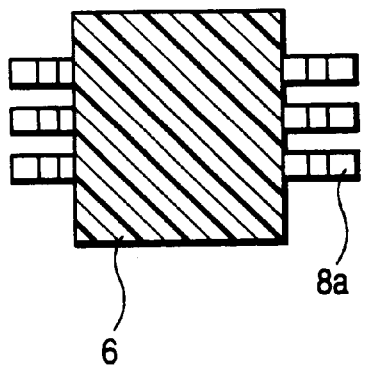
Figure 5:
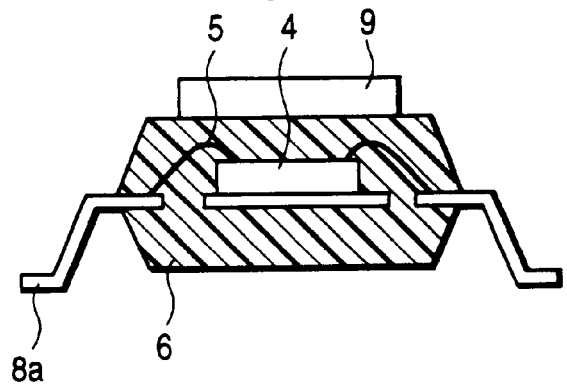
FIG. 5 is a cross-sectional view illustrating an assembly process according to a conventional technique.
Figure 6:
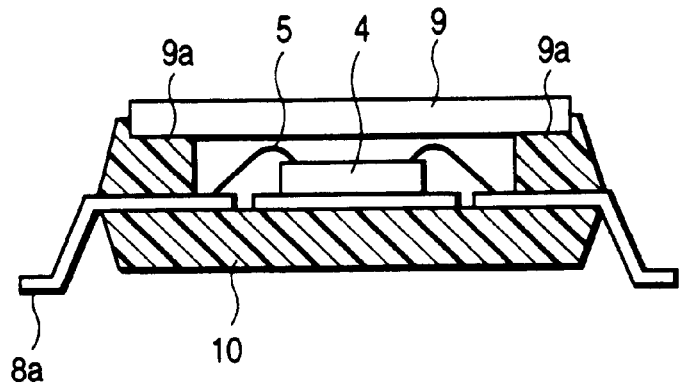
FIG. 6 is a cross-sectional view of a package according to a conventional technique.
Figure 7A:
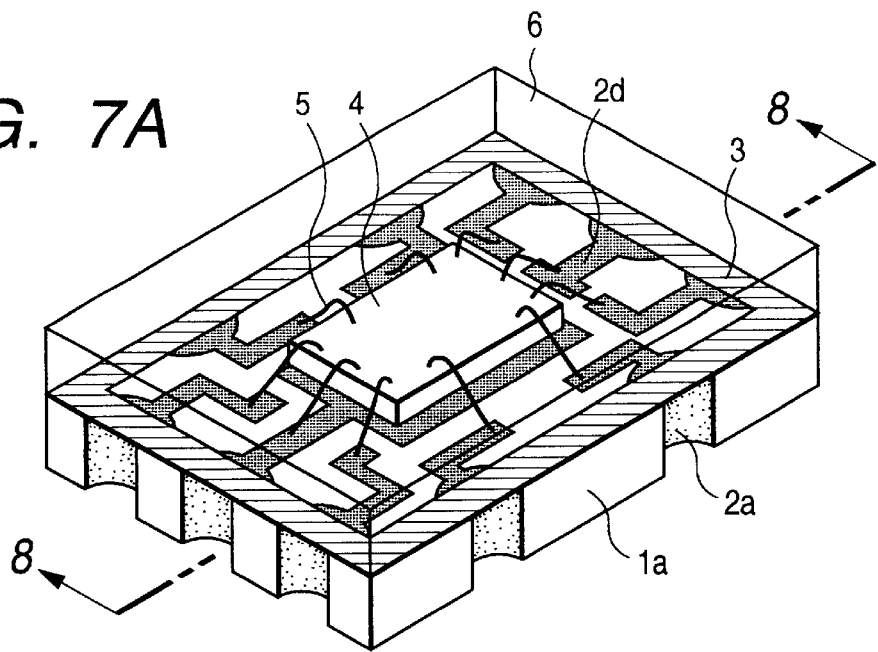
FIGS. 7A and 7B are a perspective view showing the structure of an IC package and a perspective view of a printed circuit board, according to a first embodiment of the invention.
Figure 7B:
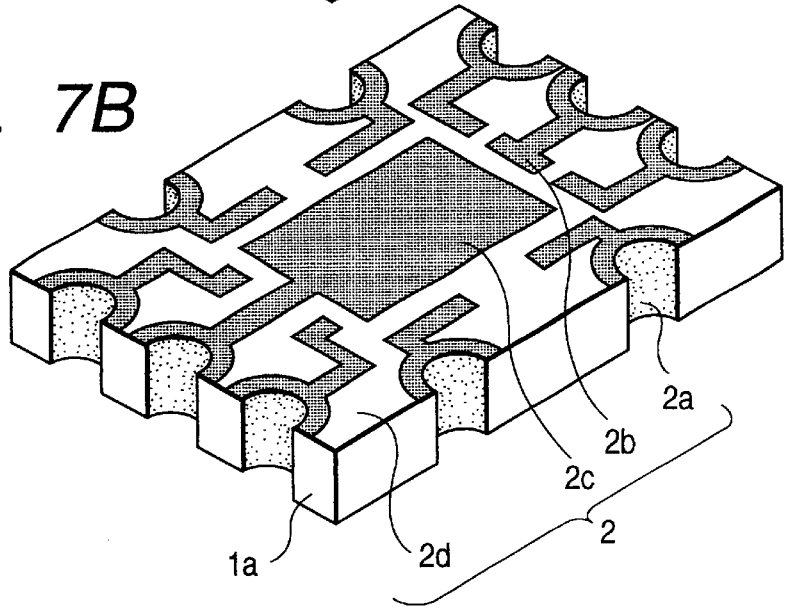
Figure 8:
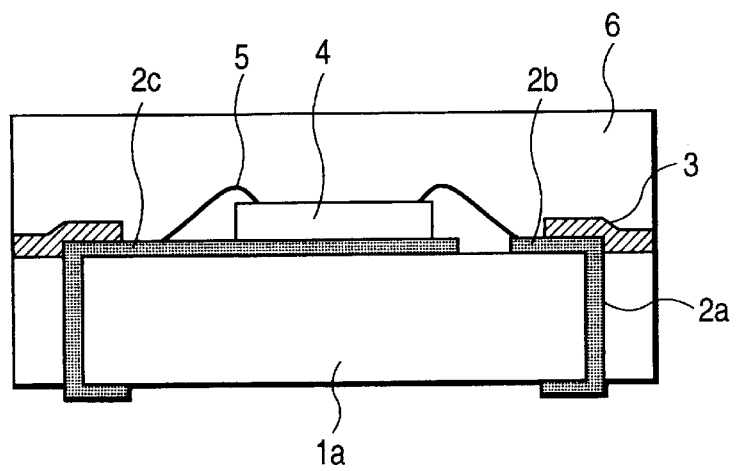
FIG. 8 is a vertical cross-sectional view of the IC package taken along line 8—8 of FIG. 7A.

FIGS. 7A and 7B are a perspective view showing the structure of an IC package and a perspective view of a printed circuit board, according to the first embodiment of the invention. FIG. 8 is a vertical cross-sectional view of the IC package taken along line 8—8 of FIG. 7A.

In FIGS. 7A and 7B and FIG. 8, reference numeral 1a represents a printed circuit board mounted on which is an IC of a semiconductor memory, a microprocessor, a digital signal processor, a photosensor, a semiconductor laser, an LED, or the like, reference numeral 2 represents a circuit pattern, reference numeral 3 represents an insulating film, reference numeral 4 represents an IC chip, reference numeral 5 represents a bonding wire, and reference numeral 6 represents a sealing resin. The circuit pattern 2 is formed on the printed circuit board 1a and is constituted by a recess portion 2a, a pad portion 2b, an IC chip mount portion 2c, and a wiring portion 2d for connecting these portions. The side wall of the recess portion 2a is plated with solderable metal so that an external circuit can be electrically connected to this soldered area which becomes an external connection terminal. The material of the printed circuit board 1a may be polyimide, glass epoxy resin, or ceramic. In this example, recess portions 2a (formed by cutting the printed circuit board along the center lines of through holes disposed in line) are formed at all four sides of the printed circuit board 1a. The recess portions 2a may be formed at desired positions depending upon the conditions of connections to external circuits. For example, the recess portions 2a may be formed only longer sides of the printed circuit board 1a of a rectangular shape. Through holes not cut may be left in the printed circuit board 1a.

The manufacture method of the IC package will be described with reference to FIGS. 9A and 9B to FIG. 12.

Figure 9A:
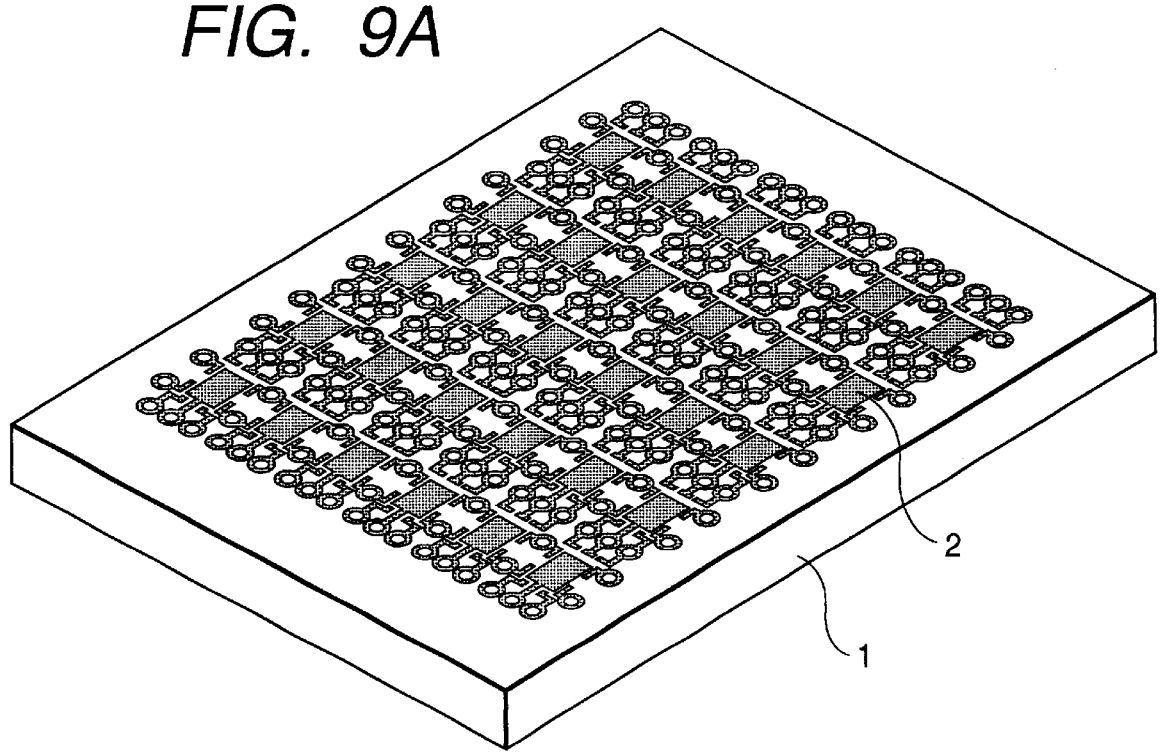
FIGS. 9A and 9B are a perspective view and an enlarged partial view, respectively illustrating the manufacture process for the IC package of the first embodiment.
Figure 9B:
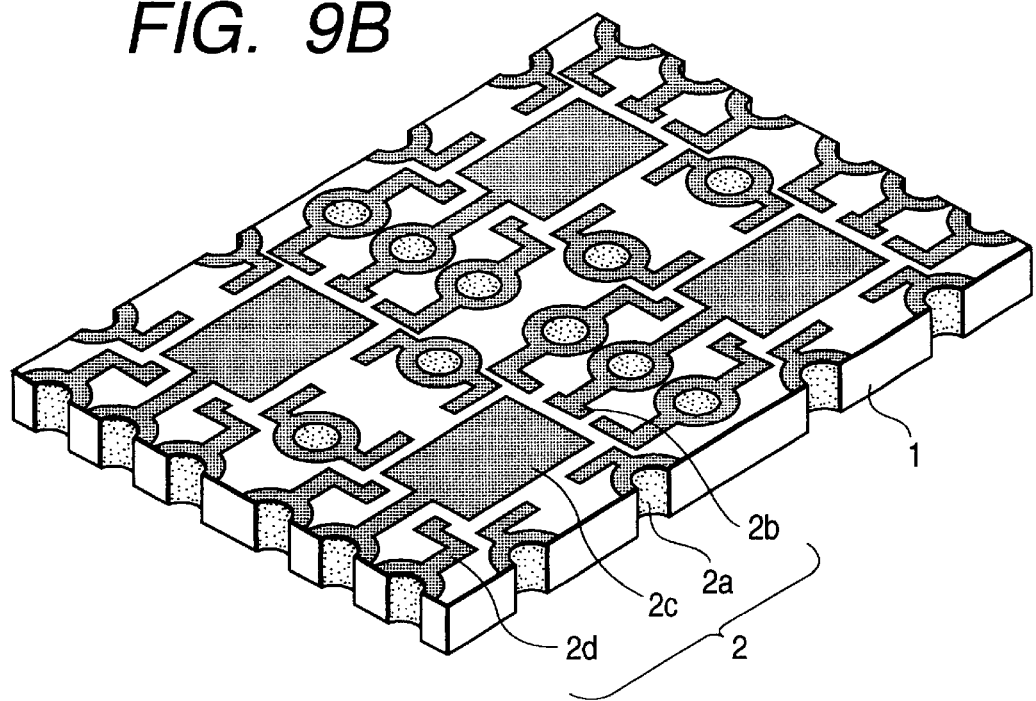

First, a printed circuit board 1 is prepared which is formed with a prescribed circuit pattern 2 as shown in FIGS. 9A and 9B. FIGS. 9A and 9B are a perspective view and an enlarged partial view, respectively of the printed circuit board. The side wall of each through hole of a cylinder or prism shape formed in the printed circuit board has been plated with solderable metal. The circuit pattern 2 is constituted by a through hole portion 2a, a pad portion 2b, an IC chip mount portion 2c, and a wiring portion 2d for connecting these portions. The through holes are disposed in a lattice pattern.

Figure 10A:
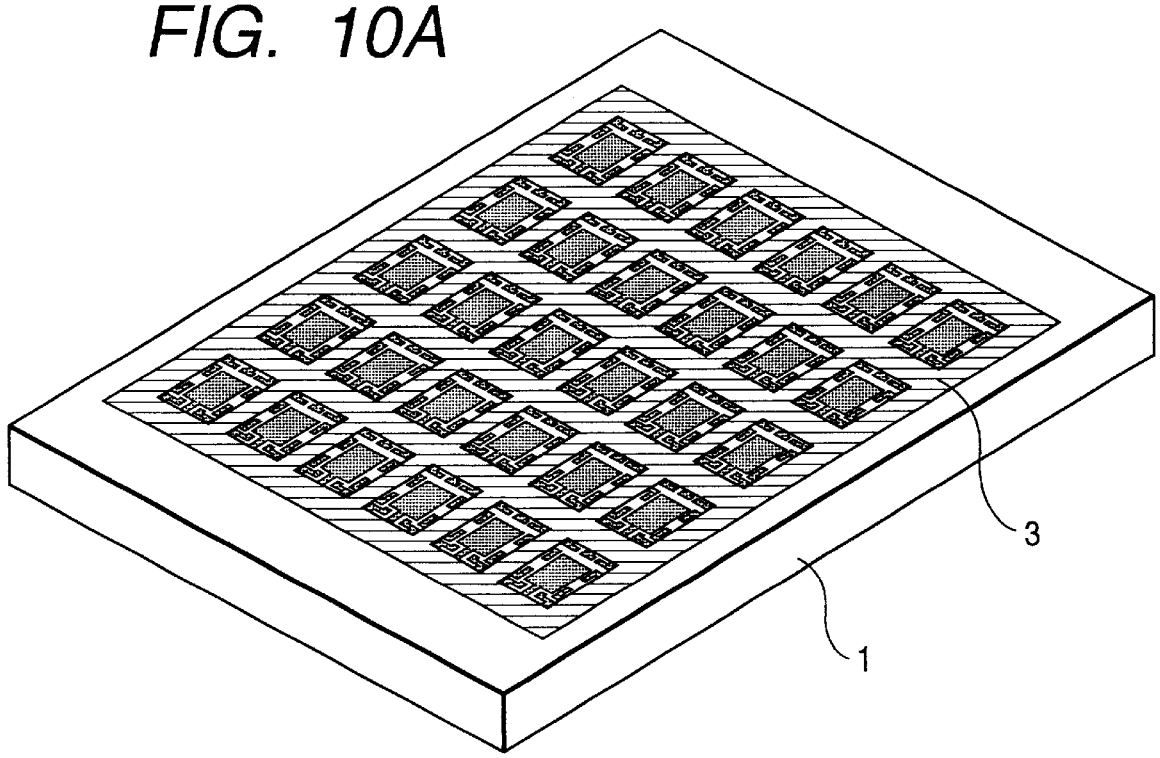
FIGS. 10A and 10B are a perspective view and an enlarged partial view, respectively illustrating the manufacture process for the IC package of the first embodiment.
Figure 10B:
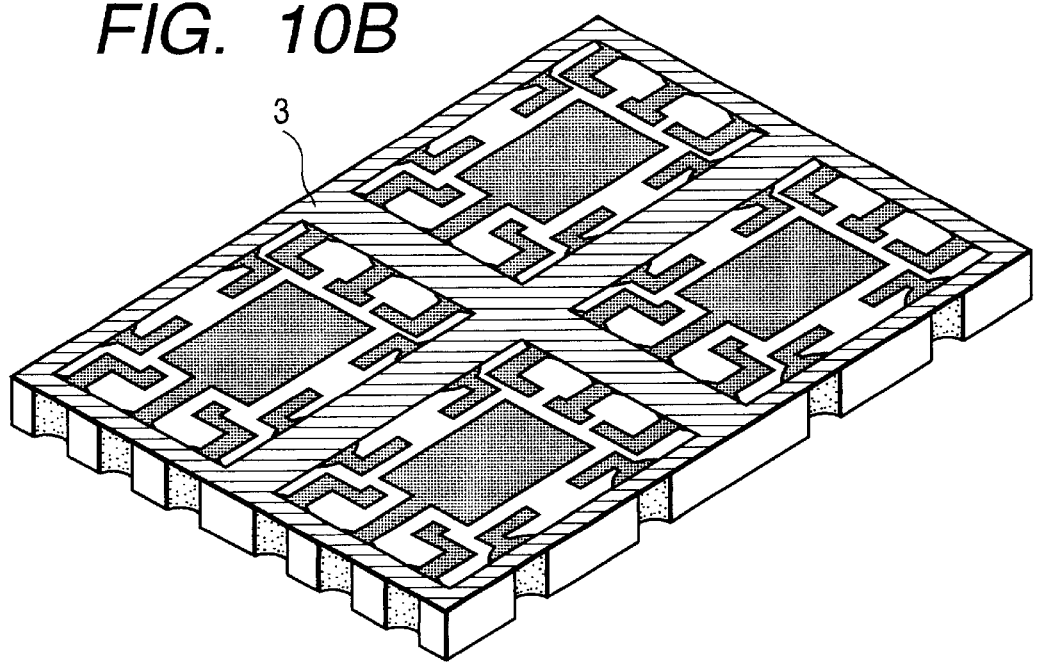
Figure 11:
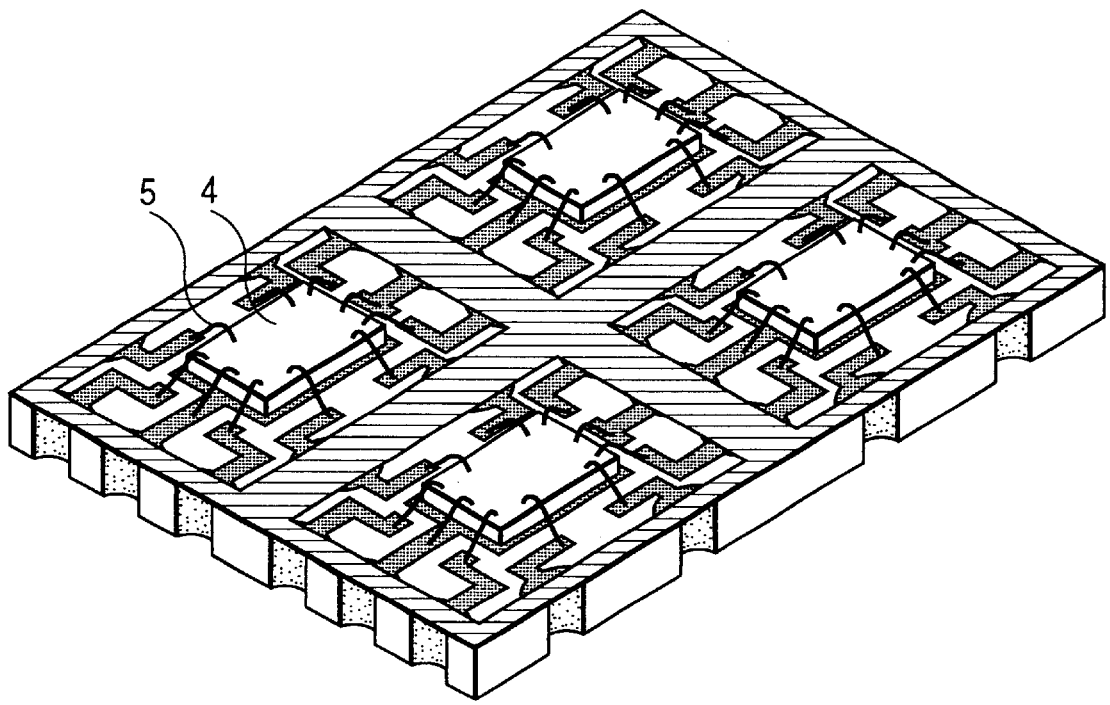
FIGS. 11 and 12 are enlarged partial views illustrating the manufacture processes for the IC package of the first embodiment.
Figure 12:
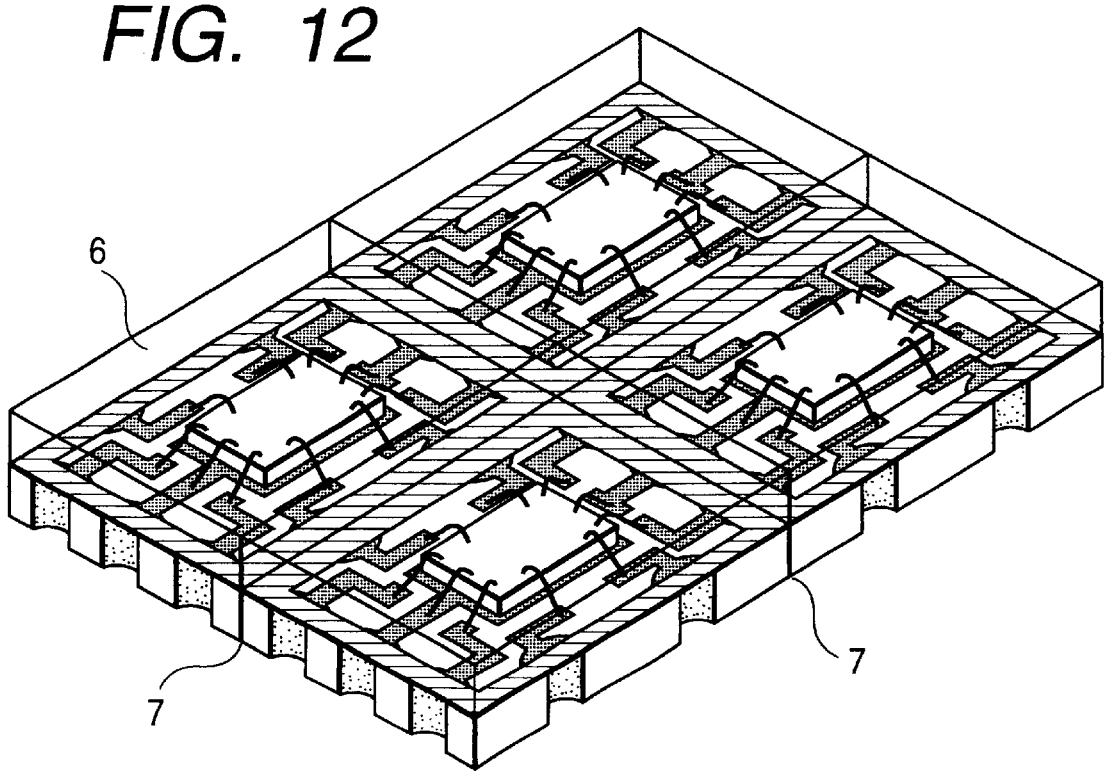

Next, as shown in FIGS. 10A and 10B, an insulating film 3 is adhered covering the openings of all through holes in the printed circuit board 1. FIG. 10A is a perspective view of the printed circuit board 1, and FIG. 10B is an enlarged partial view thereof (FIGS. 11 and 12 show only the enlarged partial views). Some unnecessary areas of the insulating film 3 may be cut in advance in a lattice shape so as to expose the areas of the pad portions 2b and IC chip mount portions 2c, or the insulating film 3 may be adhered first over the whole surface and thereafter unnecessary areas are removed. In this embodiment, the unnecessary areas were removed by the processes of mask exposure and development after a photosensitive resist film was adhered.

Thereafter, as shown in FIG. 11, IC chips are mounted and connected to the circuit pattern 2 by bonding wires 5 through a wire bonding method or the like.

Next, as shown in FIG. 12, liquid sealing resin 6 is coated on the printed circuit board 1 in order to protect the IC chip 4 and bonding wires 5. In this case, since the openings of the through holes are covered with the insulating film 3, the sealing resin 6 will not enter the through holes 2a and flow to the back surface of the printed circuit board 1. It is therefore unnecessary to determine the coating area by using a mold, mold frame, or the like. In this embodiment, although the sealing resin 6 covers the whole surface of the printed circuit board 1, it may cover only the IC chip 4 and bonding wires 5.

After the sealing resin 6 is cured through placement in environmental atmosphere, heating, ultraviolet radiation, or the like, the printed circuit board 1 is cut along a line on which through holes are aligned. In this embodiment, the printed circuit board 1 together with the sealing resin 6 is cut along a line 7 shown in FIG. 12 to obtain each lead-less package such as shown in FIG. 7A having recess portions at the side wall and external connection terminals of the conductive members at the recess portions. In the IC package manufacture method of this embodiment, the IC chips mounted on the printed circuit board may be wire bonded prior to covering the openings of through holes with the insulating film.

As apparent from the above description, an aspect of the present invention resides in that conventional printed circuit board manufacture processes can be used without a use of metal molds for resin sealing and lead frame manufacture.

A lead-less package of this structure can be soldered to external circuits at the recesses 2a by a usual surface mount method (reflow soldering or the like), so that mounting is easy and not unduly expensive.

If sealing resin is light transmissive epoxy resin such as NT-8000 (product name) manufactured by Nitto Electric Industry Co. Ltd, and if IC chips of photo-active elements are used such as a photosensor, a light emitting diode, then semiconductor optical devices can be manufactured without using metal molds.

As described so far, according to the first embodiment, a plurality of through holes in a printed circuit board can be used as external connection terminals. Therefore, metal molds for lead frames and resin sealing are not required for each type of IC chips as in conventional cases. Accordingly, immense investment in facilities is not necessary even for production of a small number of products of a variety of product types, and even for mass production with low assembly cost.

Since the side walls of the recesses exposed by cutting the printed circuit board along a line of aligned through holes are used as the external connection terminals, the mechanical structure is robust and there is less possibility of breakage.

Next, the second embodiment of the present invention will be described in detail with reference to the accompanying drawing.

Figure 13A:
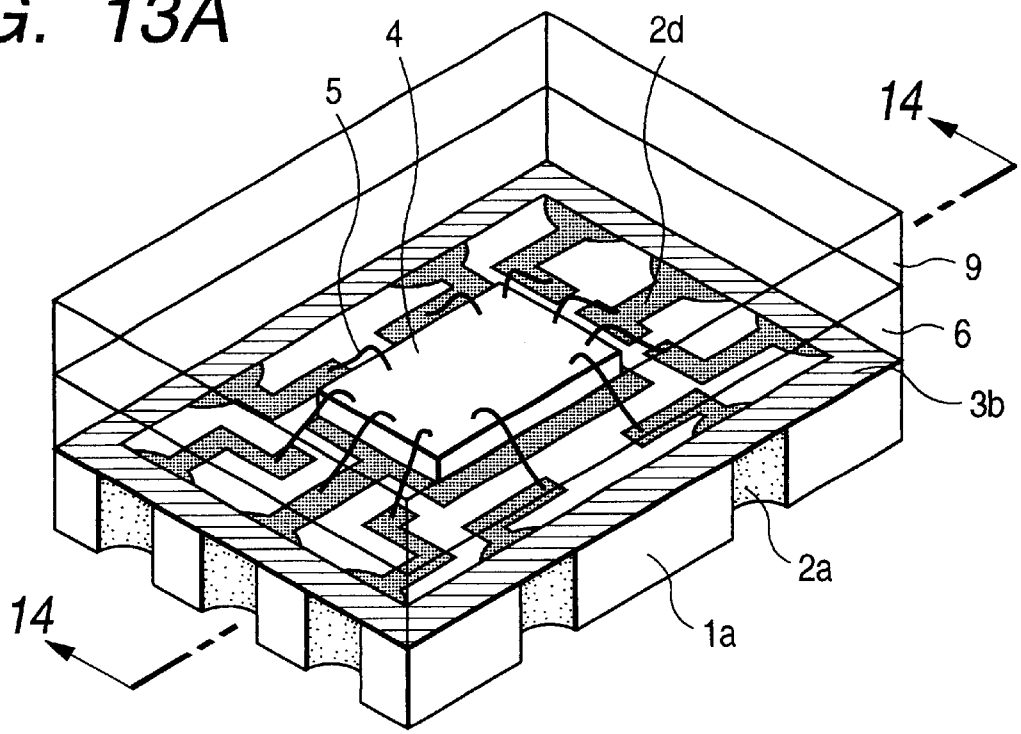
FIGS. 13A and 13B are a perspective view showing the structure of an IC package and a perspective view of a printed circuit board, according to a second embodiment of the invention.
Figure 13B:
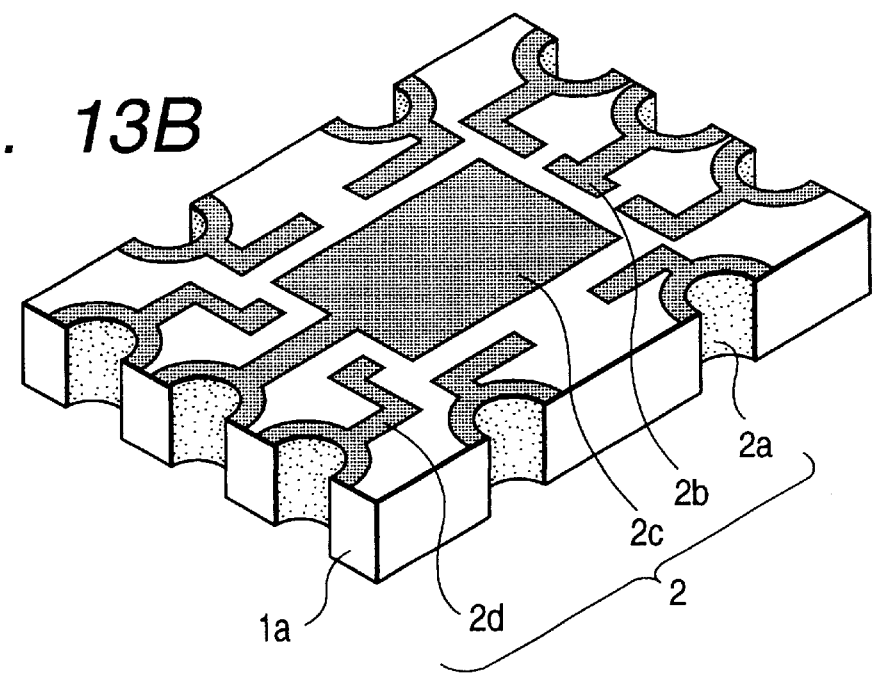
Figure 14:
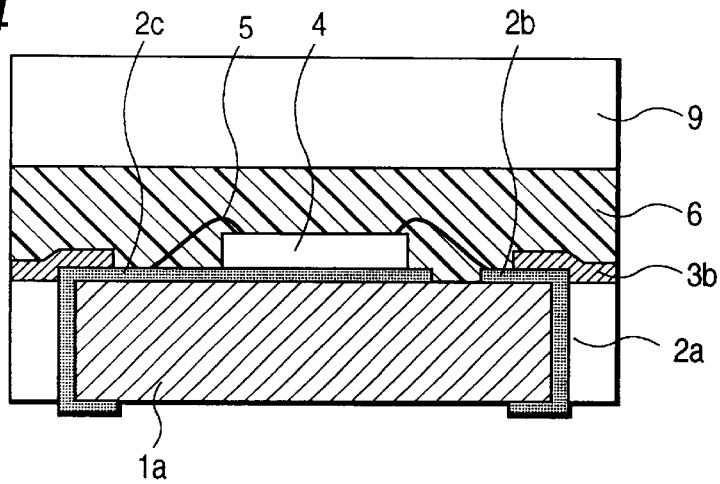
FIG. 14 is a vertical cross-sectional view of the IC package taken along line 14—14 of FIG. 13A.

FIGS. 13A and 13B are a perspective view showing the structure of an IC package and a perspective view of a printed circuit board, according to the second embodiment of the invention. FIG. 14 is a vertical cross-sectional view of the IC package taken along line 14—14 of FIG. 13A.

In FIGS. 13A and 13B and FIG. 14, reference numeral 1a represents a printed circuit board mounted on which is an IC of a semiconductor memory, a microprocessor, a digital signal processor, a photosensor, a semiconductor laser, an LED, or the like, reference numeral 2 represents a circuit pattern, reference numeral 3 represents an insulating film, reference numeral 4 represents an IC chip, reference numeral 5 represents a bonding wire, reference numeral 6 represents a sealing resin, and reference numeral 9 represents a light transmissive member. The circuit pattern 2 is formed on the printed circuit board 1a and is constituted by a recess portion (through hole portion) 2a, a pad portion 2b, an IC chip mount portion 2c, and a wiring portion 2d for connecting these portions. The side wall of the recess portion 2a is plated with solderable metal so that an external circuit can be electrically connected to this soldered area which becomes an external connection terminal. The recess portions are formed by cutting the printed circuit board along the center lines of through holes disposed in line.

Figure 15:
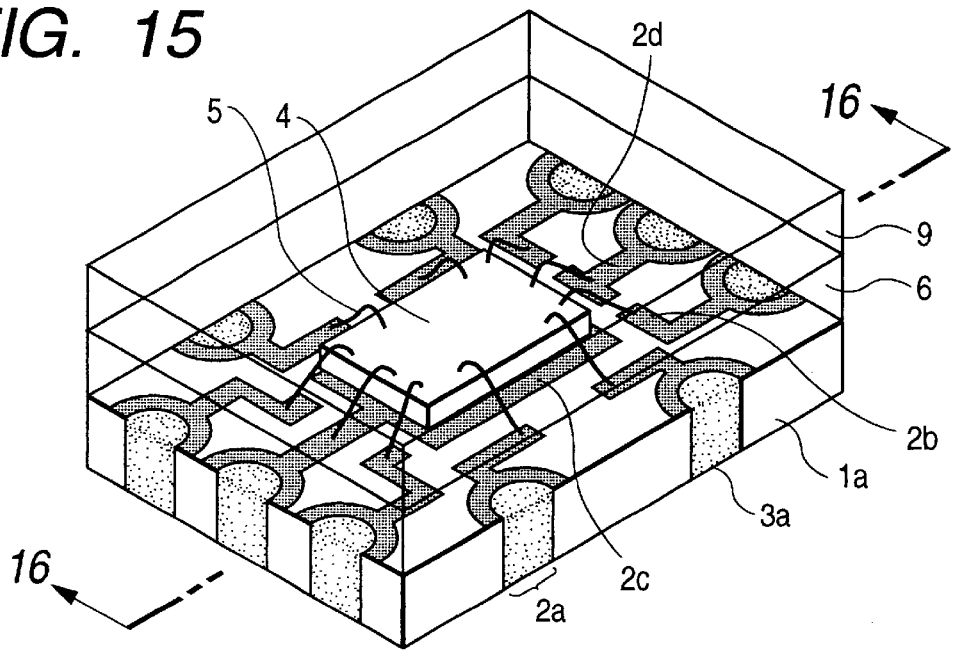
FIG. 15 is a perspective view showing the structure of an IC package according to a third embodiment of the invention.
Figure 16:
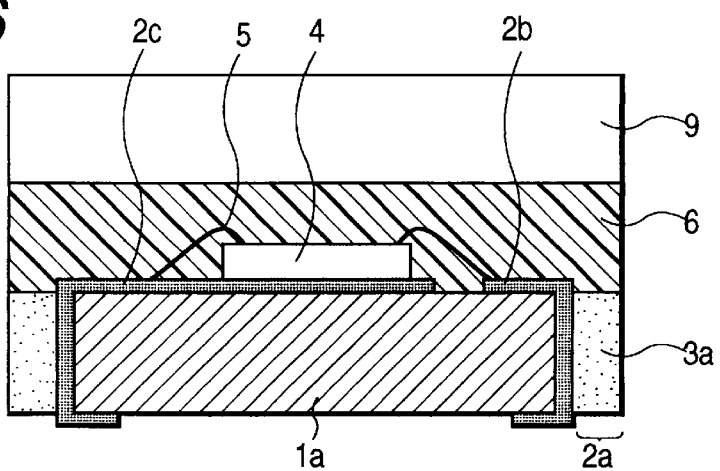
FIG. 16 is a vertical cross-sectional view of the IC package taken along line 16—16 of FIG. 15.

FIG. 15 is a perspective view showing the structure of an IC package according to the third embodiment of the invention. FIG. 16 is a vertical cross-sectional view of the IC package taken along line 16—16 of FIG. 15.

In FIGS. 15 and 16, reference numeral 1a represents a printed circuit board mounted on which is an IC of a semiconductor memory, a microprocessor, a digital signal processor, a photosensor, a semiconductor laser, an LED, or the like, reference numeral 2 represents a circuit pattern, reference numeral 3 represents an insulating film, reference numeral 4 represents an IC chip, reference numeral 5 represents a bonding wire, reference numeral 6 represents a sealing resin, and reference numeral 9 represents a light permissive member. The circuit pattern 2 is formed on the printed circuit board la and is constituted by a through hole portion 2a, a pad portion 2b, an IC chip mount portion 2c, and a wiring portion 2d for connecting these portions. The through hole portion 2a is filled with conductive material 3a so that an external circuit can be electrically connected to this conducive material by soldering, the conductive material becoming an external connection terminal.

The material of the printed circuit board 1a may be polyimide, glass epoxy resin, or ceramic. In the second and third embodiments, through hole portions 2a are formed at all four sides of the printed circuit board 1a. The through hole portions 2a may be formed at desired positions depending upon the conditions of connections to external circuits. For example, the through hole portions 2a may be formed only in the longer sides of the printed circuit board 1a of a rectangular shape. Through holes not cut may be left in the printed circuit board 1a.

The manufacture method of the IC package will be described with reference to FIG. 17A to FIG. 22. In this method, an IC of a photosensor as a semiconductor optical element is used by way of example.

Figure 17A:
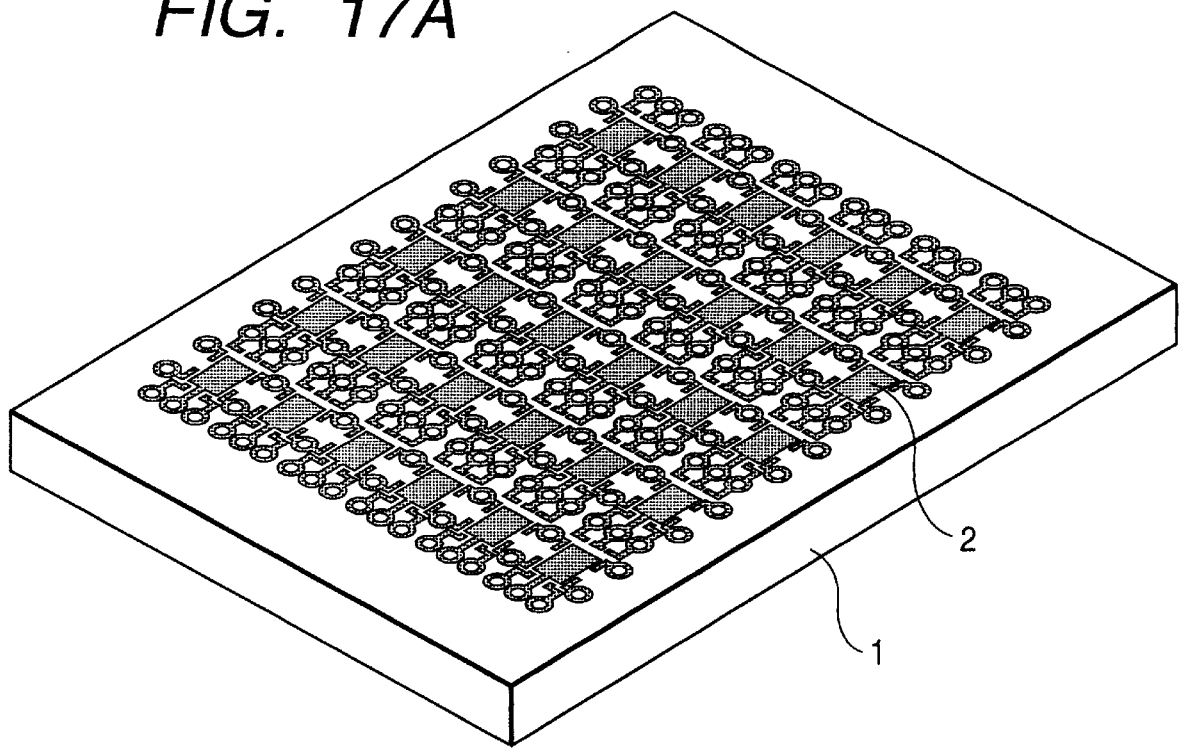
FIGS. 17A and 17B are a perspective view and an enlarged partial view, respectively illustrating the manufacture process for the IC package of the third embodiment.
Figure 17B:
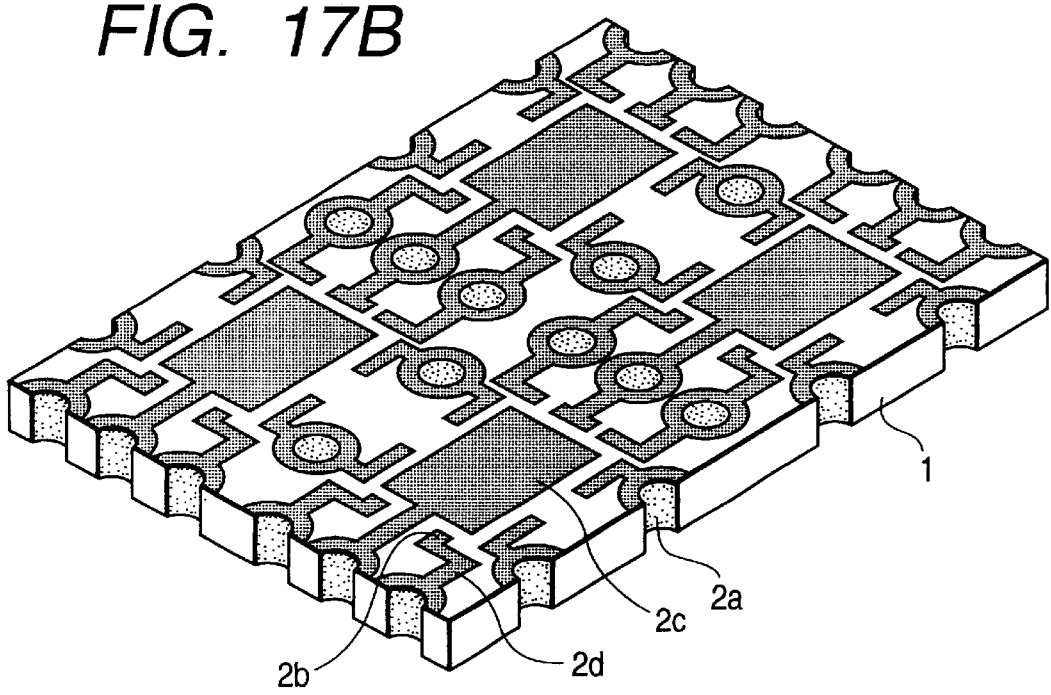

First, a printed circuit board 1 is prepared which is formed with a prescribed circuit pattern 2 as shown in FIGS. 17A and 17B. FIGS. 17A and 17B are a perspective view and an enlarged partial view, respectively of the printed circuit board. The side wall of each through hole formed in the printed circuit board has been plated with solderable metal. The circuit pattern 2 is constituted by a through hole portion 2a, a pad portion 2b, an IC chip mount portion 2c, and a wiring portion 2d for connecting these portions.

Figure 18A:
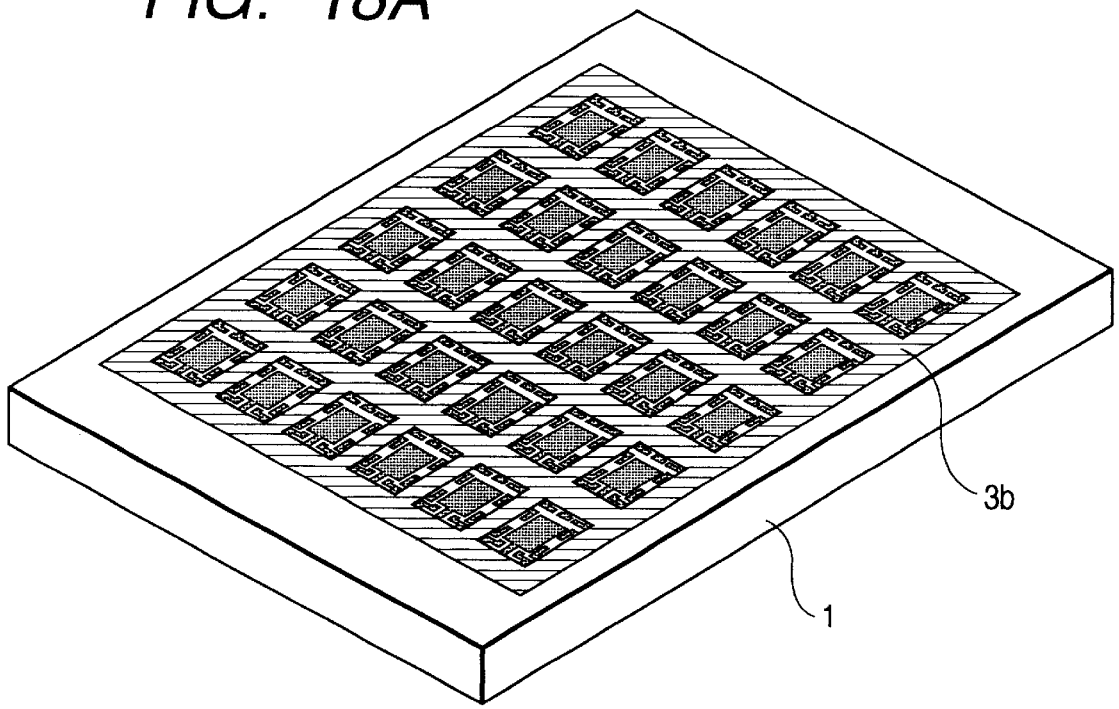
FIGS. 18A and 18B are a perspective view and an enlarged partial view, respectively illustrating the manufacture process for the IC package of the third embodiment.
Figure 18B:
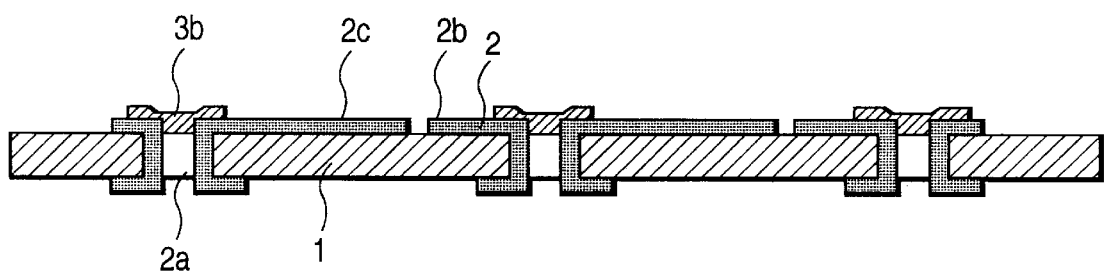
Figure 19:
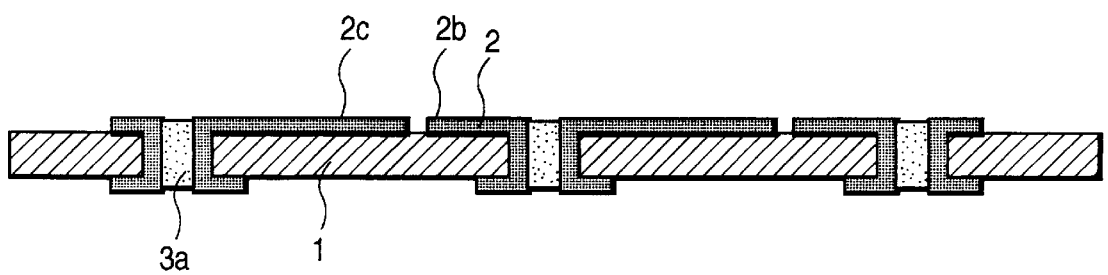
FIGS. 19 to 22 are cross-sectional views illustrating the manufacture processes for the IC packages of the third embodiment.

Next, all the through holes in the printed circuit board 1 are filled with conductive material 3a as shown in FIG. 19, or covered with an insulating film 3b. FIG. 18A is a perspective view of the printed circuit board covered with the insulating films, and FIG. 18B is an enlarge partial view in section of the printed circuit board. FIG. 19 is an enlarged partial view in section of the printed circuit board with through holes being filled with conductive material (FIGS. 20 to 22 show only the enlarged partial views in section).

Although the through holes are filled with the conductive material 3a after plating, they may be filled by the same single process. In covering the through holes with the insulating film 3b, some unnecessary areas of the insulating film 3b may be cut in advance (for example, in a lattice shape) or it may be adhered first over the whole surface and thereafter unnecessary areas are removed. In this embodiment, the unnecessary areas were removed by the processes of mask exposure and development after a photosensitive resist film was adhered. In FIGS. 20 to 22, for drawing simplicity, the printed circuit board with through holes being filled with the conductive material 3a is omitted, and only the printed circuit using the insulating film 3b is shown. The same processes are executed for both types of the printed circuit boards.

Figure 20:
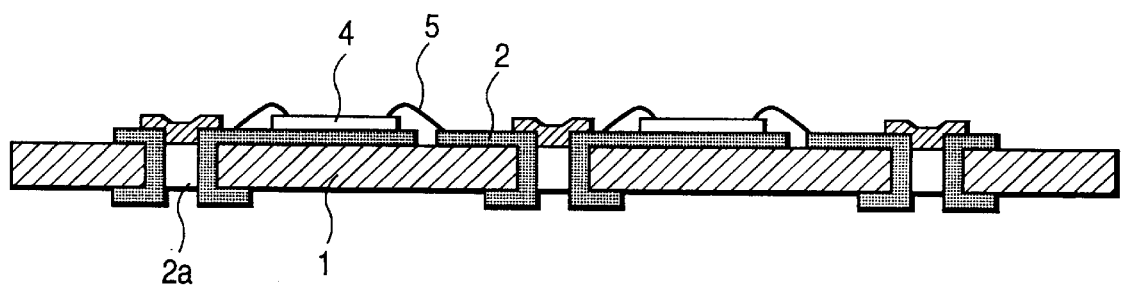

Thereafter, as shown in FIG. 20, IC chips are mounted and connected to the circuit or lead pattern 2 by bonding wires 5 through a wire bonding method or the like.

Figure 21:
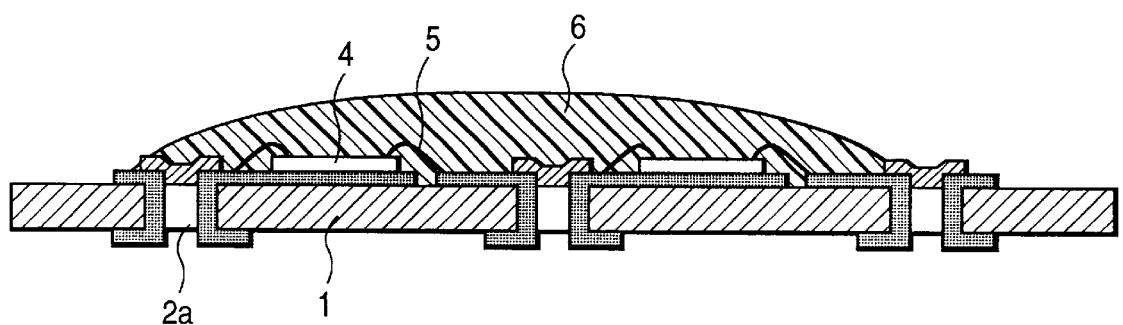
Figure 22:
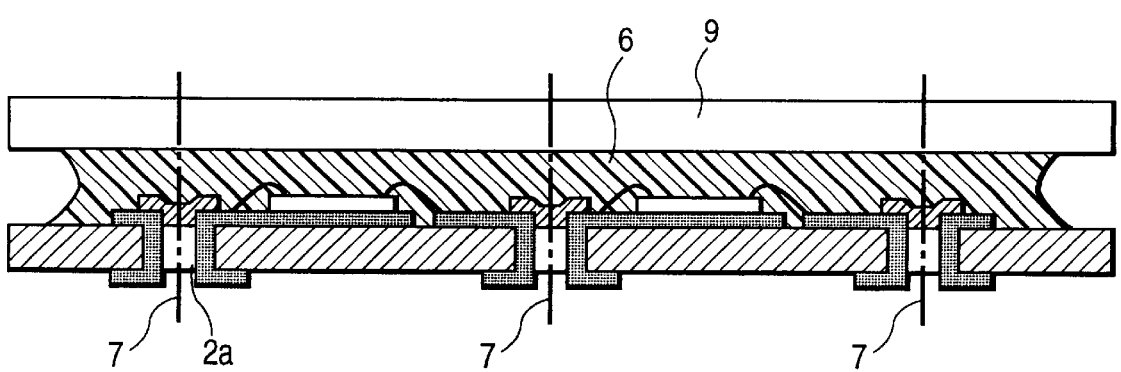

Next, as shown in FIG. 21, liquid sealing resin 6 is coated on the printed circuit board 1 in order to protect the IC chip 4 and bonding wires 5. In this case, since the openings of the through holes are filled with the conductive material 3a (not shown) or covered with the insulating film 3, the sealing resin 6 will not enter the through holes 2a and flow to the back surface of the printed circuit board 1. It is therefore unnecessary to determine the coating area by using a mold, mold frame, or the like.

As shown in FIG. 22, prior to curing of the transparent resin 6, the light transmissive member 9 is placed on the transparent resin 6 in parallel to the printed circuit board 1 to make the gap between the printed circuit board 1 and light transmissive member 9 be filled with the transparent resin 6.

After the transparent resin 6 is cured through placement in environmental atmosphere, heating, ultraviolet radiation, or the like while the gap between the printed circuit board 1 and light transmissive member 9 is maintained constant by using a jig (not shown) or the like, the printed circuit board 1 is cut along a line on which through holes are aligned. In these embodiments, the printed circuit board 1 together with the sealing resin 6 and light transmissive member 9 is cut along a line 7 such as shown in FIG. 22 to obtain each lead-less package such as shown in FIGS. 13A to 14 of the second embodiment and each lead-less package such as shown in FIG. 16 of the third embodiment. In the photosensor IC package manufacture method of this embodiment, the IC chips mounted on the printed circuit board may be wire bonded prior to filling in the openings of the through holes.

As apparent from the above description, an aspect of the present invention resides in that conventional printed circuit board manufacture processes can be used without a use of metal molds for resin sealing and lead frame manufacture.

A lead-less package of this structure can be soldered to external circuits by a usual surface mounting method (reflow soldering or the like), so that mounting is easy and not unduly expensive.

In the above embodiments, BT resin (product name) manufactured by Mitsubishi Gas Chemical Co. Ltd was used for the printed circuit board 1, a photosensitive resist film was used for the insulating film 3b, World Lock No. 801 SE-L and XVL-01L (product names) manufactured by Kyoritsu Chemical Industry Co. Ltd. were used as the transparent resin 6, and a phosphosilicate glass plate was uses as the light transmissive member 9. IC packages excellent in heat resistance of solder and optical performance were able to be manufactured.

If an infrared cut filter made of CM-5000 (product name) manufactured by HOYA CORP. is used in place of the light transmissive member 9, the spectral sensitivity of the photosensor can be adjusted, to form a photosensor with other desired characteristics. If a specific color is to be cut, colored resin or light transmissive member may be used. In the case of an IC not using light, non-light transmissive resin or other materials may be used.

Figure 23:
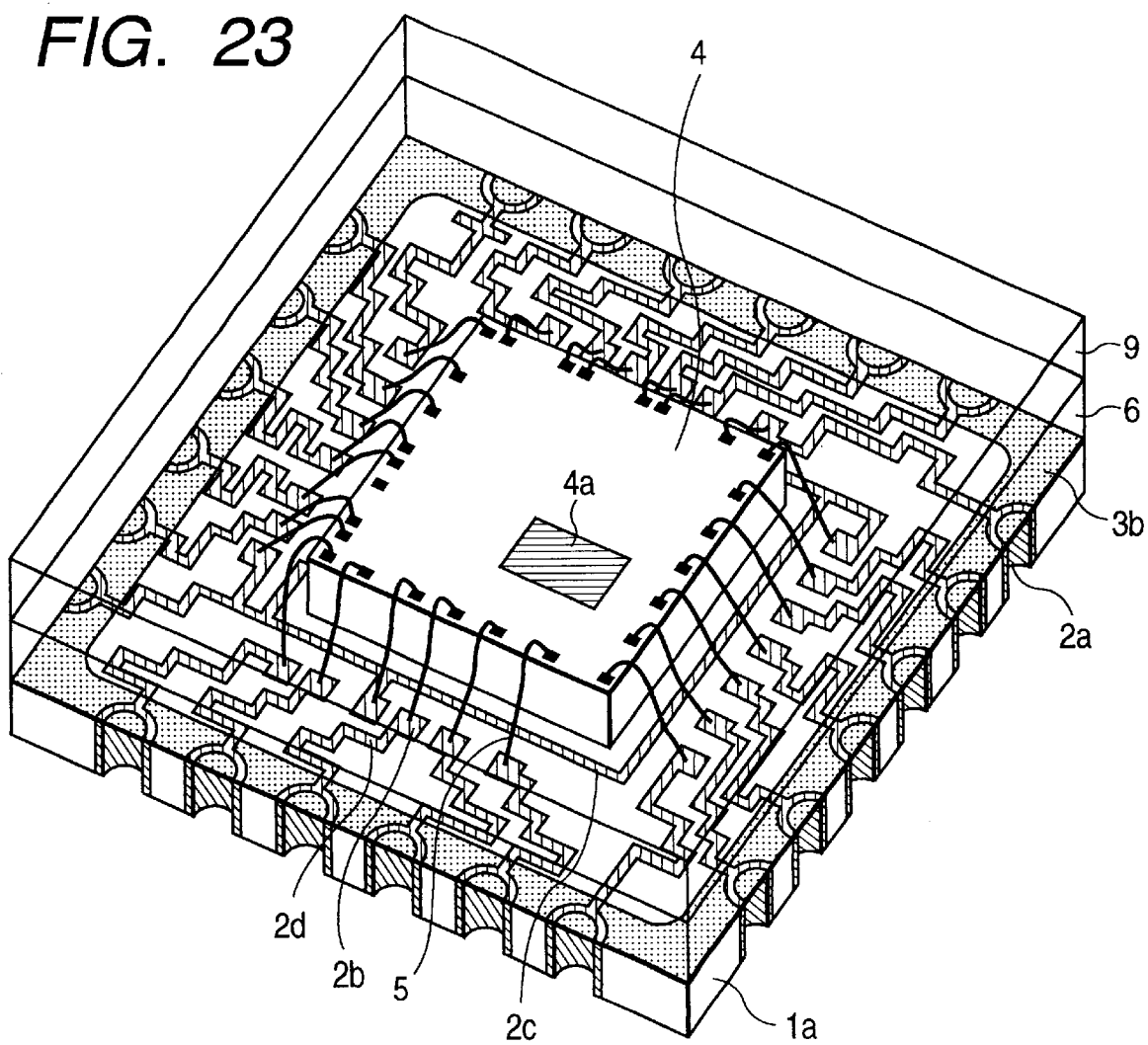
FIG. 23 is a perspective view of an IC package according to another embodiment of the invention.
Figure 24:
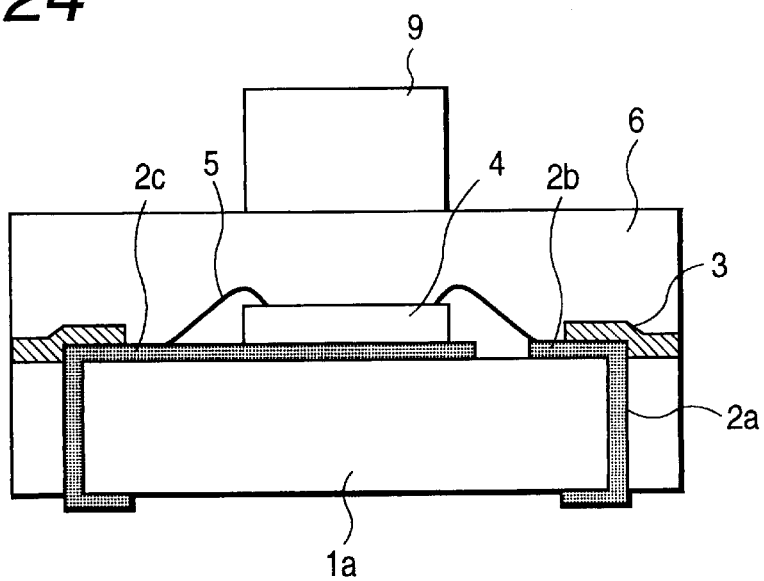
FIG. 24 is a schematic cross-sectional view showing a modification of the IC package shown in FIG. 13.

FIG. 23 is a perspective view of an IC package according to another embodiment of the invention.

Recesses 2a to be used as external connection terminals are provided at the four sides of a printed circuit board 1a. An IC chip 4 is disposed on a chip mount portion 2c at the upper surface of the board 1a.

Bonding pads of the IC chip 4 and bonding pad areas of a wiring patter are electrically connected by bonding wires 5.

The length of the wiring pattern 2d is made longer so that corrosion can be avoided which is otherwise caused by water entering from the edges of the IC package. In order to dispose a longer wiring pattern in a narrow space, the wiring pattern 2d is deflected at several points as shown in FIG. 23.

Water contents infiltrate such packages along a conductive wiring pattern. Therefore, if the effective length from the external connection terminal 2a to the bonding pad area 2b is elongated, durability of the IC package can be improved.

Reference numeral 3b represents an insulting film, reference numeral 6 represents resin, and reference numeral 9 represents a protective member.

In this embodiment, an optical active element is used as the IC chip 4, transparent resin was selected as the resin 6, and a light transmissive rigid member was selected as the member 9.

For the IC package, particularly an IC package using an optical active element, it is necessary for the thickness (length) from the package surface to the light receiving portion (or light emitting portion) to be relatively neat in order to avoid adverse effects from reflected light (Japanese Patent Laid-open Application No. 63-21878). In this embodiment, the member 9 is adhered to make the thickness from the surface of the member 9 to the light receiving portion 4a thicker.

This IC package can by manufactured by the method illustrated with reference to FIGS. 17A to 22.

If an IC chip with an optical semiconductor device is used, a member may be adhered to the package resin 6, the member 9 may be adhered after each package is cut after curing of the resin, or may be adhered to each cured resin and thereafter each package is cut. Since these methods may lower throughput, as described with FIGS. 17A to 22, preferably, after the member 9 is disposed, the resin is cured and then the member 9, cured resin 6, and the printed circuit board 1 are cut at the same time.

As described so far, according to the invention, a plurality of through holes in a printed circuit board can be used as external connection terminals. Therefore, metal molds for lead frames and resin sealing are not required to be prepared for each type of IC chips as in conventional cases. Accordingly, immense investment in facilities is not necessary even for production of a small number of products of a variety of product types, and even for mass production with low assembly cost.

Since the soldering margin for the light transmissive member is not necessary, the outer dimension of the IC package can be made very small.

Since the side walls of the recesses exposed by cutting the printed circuit board along a line of aligned through holes are used as the external connection terminals, the mechanical structure is robust and there is less possibility of breakage.

What is claimed is:

1. A method of producing an IC package comprising the steps of:
    preparing a substrate having formed therein a plurality of through-holes each having a conductive portion therein;
    mounting a plurality of IC chips spacedly apart from each other on a surface of the substrate and electrically connecting each of the plurality of IC chips to a corresponding one of the conductive portions in the plurality of through-holes;
    applying to the surface of the substrate a resin for encapsulating the plurality of IC chips with the through-holes being closed;
    arranging a rigid plate member above the plurality of IC chips with the resin between the member and the surface of the substrate;
    curing the resin after the arranging step; and
    cutting the substrate together with the member and the cured resin so as to part the through-hole.

2. The method according to claim 1, wherein the cured resin and the member are light-transmissive and the plurality of IC chips are optically active elements each having a light receiving portion or light emitting portion.

3. The method according to claim 2, wherein the optically active element is one selected from an optical sensor, a semiconductor laser or an LED.

4. The method according to claim 1, wherein an insulating film is provided so as to cover an opening of the through-hole at the surface of the substrate to close the through-hole.

5. The method according to claim 1, wherein the through-hole is filled with a conductive material to close the through-hole.

6. A method of producing an IC package comprising the steps of:
    preparing a substrate having formed therein a plurality of through-holes each having a conductive portion therein;
    mounting a plurality of IC chips spacedly apart from each other on a surface of the substrate and electrically connecting each of the plurality of IC chips to a corresponding one of the conductive portions in the plurality of through-holes;
    applying to the surface of the substrate a resin for encapsulating the plurality of IC chips with the through-holes being closed;
    arranging a rigid plate member above the plurality of IC chips with the resin between the member and the surface of the substrate;
    curing the resin after the arranging step; and
    cutting the substrate together with the member and the cured resin to provide a plurality of discrete sections each having one of the plurality of IC chips.

7. The method according to claim 6, wherein the cured resin and the member are light-transmissive and the plurality of IC chips are optically active elements each having a light receiving portion or light emitting portion.

8. The method according to claim 7, wherein the optically active element is one selected from an optical sensor, a semiconductor laser or an LED.

9. The method according to claim 6, wherein an insulating film is provided on an opening of the through-hole at the surface of the substrate to close the through-hole.

10. The method according to claim 6, wherein the through-hole is filled with a conductive material to close the through-hole.

11. A method of producing an IC package comprising the steps of:
    preparing a substrate having formed therein a plurality of through-holes each having a conductive portion therein;
    mounting a plurality of IC chips spacedly apart from each other on a surface of the substrate and electrically connecting each of the plurality of IC chips to a corresponding one of the conductive portions in the plurality of through-holes;
    applying to the surface of the substrate a resin for encapsulating the plurality of IC chips;
    arranging a rigid plate member above the plurality of IC chips with the resin between the member and the surface of the substrate;
    curing the resin after the arranging step; and
    cutting the substrate together with the member and the cured resin so as to part the through-hole.

12. The method according to claim 11, wherein the cured resin and the member are light-transmissive and the plurality of IC chips are optically active elements each having a light receiving portion or light emitting portion.

13. The method according to claim 12, wherein the optically active element is one selected from an optical sensor, a semiconductor laser or an LED.

14. The method according to claim 11, wherein an insulating film is provided on an opening of the through-hole at the surface of the substrate to close the through-hole.

15. The method according to claim 11, wherein the through-hole is filled with a conductive material to close the through-hole.

16. A method of producing an IC package comprising the steps of:
    preparing a substrate having formed therein a plurality of through-holes each having a conductive portion therein;
    mounting an IC chip on a surface of the substrate and electrically connecting the IC chip to the conductive portion in the through-hole;
    applying to the surface of the substrate a resin for encapsulating the IC chip with the through-hole being closed;
    arranging a rigid plate member above the IC chip with the resin between the member and the surface of the substrate;
    curing the resin after the arranging step; and
    cutting the substrate together with the member and the cured resin at the through-hole.

17. The method according to claim 16, wherein the cured resin and the member are light-transmissive and the plurality of IC chips are optically active elements each having a light receiving portion or light emitting portion.

18. The method according to claim 17, wherein the optically active element is one selected from an optical sensor, a semiconductor laser or an LED.

19. The method according to claim 16, wherein an insulating film is provided on an opening of the through-hole at the surface of the substrate to close the through-hole.

20. The method according to claim 16, wherein the through-hole is filled with a conductive material to close the through-hole.

21. A method of producing an IC package with an optically active element comprising the steps of:

preparing a substrate having formed therein a plurality of through-holes each having a conductive portion therein;

mounting a plurality of optically active elements spacedly apart from each other on a surface of the substrate and electrically connecting each of the plurality of optically active elements to a corresponding one of the conductive portions in the plurality of through-holes;

applying to the surface of the substrate a light-transmissive resin for encapsulating the plurality of optically active elements with the through-holes being closed;

arranging a light-transmissive, rigid plate member above the plurality of optically active elements with the light-transmissive resin between the light-transmissive member and the surface of the substrate;

curing the light-transmissive resin after the arranging step; and cutting the substrate together with the light-transmissive member and the cured light-transmissive resin so as to part the through-hole.

22. The method according to claim 21, wherein the optically active element is one selected from an optical sensor, a semiconductor laser or an LED.

23. The method according to claim 21, wherein an insulating film is provided on an opening of the through-hole at the surface of the substrate to close the through-hole.

24. The method according to claim 21, wherein the through-hole is filled with a conductive material to close the through-hole.

25. A method of producing an IC package with an optically active element comprising the steps of:

preparing a substrate having formed therein a plurality of through-holes each having a conductive portion therein;

mounting an optically active element on a surface of the substrate and electrically connecting the optically active element to the conductive portion in the through-hole;

applying to the surface of the substrate a light-transmissive resin for encapsulating the optically active element;

arranging a light-transmissive rigid plate member above the optically active element with the light-transmissive resin between the light-transmissive member and the surface of the substrate;

curing the light-transmissive resin after the arranging step; and cutting the substrate together with the light-transmissive member and the cured light-transmissive resin.

26. The method according to claim 25, wherein the optically active element is one selected from an optical sensor, a semiconductor laser or an LED.

27. The method according to claim 25, wherein an insulating film is provided on an opening of the through-hole at the surface of the substrate to close the through-hole.

28. The method according to claim 25, wherein the through-hole is filled with a conductive material to close the through-hole.

29. A method of producing an IC package comprising the steps of:

preparing a substrate having formed therein a plurality of through-holes each having a conductive portion therein;

mounting an IC chip on a surface of the substrate and electrically connecting the IC chip to the conductive portion in the through-hole;

applying to the surface of the substrate a resin for encapsulating the IC chip; arranging a rigid plate member above the IC chip with the resin between the member and the surface of the substrate;

curing the resin after the arranging step; and cutting the substrate together with the cured resin.

30. The method according to claim 29, wherein the cured resin and the member are light-transmissive and the plurality of IC chips are optically active elements each having a light receiving portion or light emitting portion.

31. The method according to claim 30, wherein the optically active element is one selected from an optical sensor, a semiconductor laser or an LED.

32. The method according to claim 29, wherein an insulating film is provided on an opening of the through-hole at the surface of the substrate to close the through-hole.

33. The method according to claim 29, wherein the through-hole is filled with a conductive material to close the through-hole.

* * * * *

UNITED STATES PATENT AND TRADEMARK OFFICE
CERTIFICATE OF CORRECTION

PATENT NO. : 6,383,835 B1
DATED : May 7, 2002
INVENTOR(S) : Fumio Hata et al.

It is certified that error appears in the above-identified patent and that said Letters Patent is hereby corrected as shown below:

<u>Title page,</u>
Item [56], FOREIGN PATENT DOCUMENTS,
"63021878" should read -- 63-21878 --; and
"2002150" should read -- 2-2150 --.
OTHER PUBLICATIONS, "Abstract" should read -- Abstracts --.
Item [57], ABSTRACT,
Line 14, "cut" should read -- cutting --.

<u>Column 1,</u>
Line 29, "damages" should read -- damage --.

<u>Column 2,</u>
Lines 5, 16, 35 and 48, "invention is" should read -- invention, there is --;
Line 13, "cut" should read -- cutting --;
Line 26, "It is another object" should read -- According to another aspect -- and "invention to provide" should read -- invention, there is provided --;
Line 51, "opening;" should read -- openings; --; and
Line 60, "thus" should read -- thus, --.

<u>Column 3,</u>
Line 63, "packages" should read -- package --.

<u>Column 5,</u>
Line 35, "photo-active" should read -- photoactive --; and
Line 56, "drawing." should read -- drawings. --.

<u>Column 6,</u>
Line 27, "permissive" should read -- transmissive --;
Line 28, "1a" should read -- *1a* --;
Line 33, "conducive" should read -- conductive --; and
Line 63, "enlarge" should read -- enlarged --.

<u>Column 7,</u>
Line 63, "uses" should read -- used --.

UNITED STATES PATENT AND TRADEMARK OFFICE
CERTIFICATE OF CORRECTION

PATENT NO. : 6,383,835 B1
DATED : May 7, 2002
INVENTOR(S) : Fumio Hata et al.

It is certified that error appears in the above-identified patent and that said Letters Patent is hereby corrected as shown below:

<u>Column 8,</u>
Line 26, "insulting" should read -- insulating --; and
Line 36, "neat" should read -- great --.

Signed and Sealed this

Eleventh Day of February, 2003

JAMES E. ROGAN
*Director of the United States Patent and Trademark Office*

UNITED STATES PATENT AND TRADEMARK OFFICE
CERTIFICATE OF CORRECTION

PATENT NO.    : 6,383,835 B1
DATED         : May 7, 2002
INVENTOR(S)   : Hata et al.

It is certified that error appears in the above-identified patent and that said Letters Patent is hereby corrected as shown below:

<u>Title page,</u>
Item [*] Notice, "Subject to any disclaimer, the term of this patent is extended or adjusted under 35 USC 154(b) by (0) days", delete the phrase "by 0 days" and insert -- by 31 days --

Signed and Sealed this

Fourteenth Day of October, 2003

JAMES E. ROGAN
*Director of the United States Patent and Trademark Office*